US010771038B2

(12) United States Patent
Toshikawa et al.

(10) Patent No.: US 10,771,038 B2
(45) Date of Patent: Sep. 8, 2020

(54) CRYSTAL UNIT (71) Applicant: NIHON DEMPA KOGYO CO., LTD., Tokyo (JP)

(72) Inventors: Koji Toshikawa, Saitama (JP); Shinobu Yoshida, Saitama (JP); Hirokazu Iwata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/391,330

(22) Filed: Apr. 23, 2019

(65) Prior Publication Data
US 2019/0326876 A1 Oct. 24, 2019

(30) Foreign Application Priority Data

Apr. 24, 2018 (JP) ................. 2018-083011

(51) Int. Cl.
*H03B 5/32* (2006.01)
*H03H 9/19* (2006.01)
*H03H 9/02* (2006.01)
*H03H 3/02* (2006.01)

(52) U.S. Cl.
CPC .......... *H03H 9/02023* (2013.01); *H03B 5/32* (2013.01); *H03H 3/02* (2013.01); *H03H 9/19* (2013.01); *H03B 2200/0018* (2013.01)

(58) Field of Classification Search
CPC .. H01L 41/18; H03B 5/30; H03B 5/32; H03B 2200/0018; H03H 3/02; H03H 9/02023; H03H 9/17; H03H 9/19; H03H 2003/022
USPC ........................................................ 331/158
See application file for complete search history.

(56) References Cited

U.S. PATENT DOCUMENTS

| 2003/0006853 A1* | 1/2003 | Yamanaka | ............... G01G 3/13 331/158 |
| 2005/0231078 A1* | 10/2005 | Tanaka | ............... H03H 9/02086 310/333 |
| 2010/0164325 A1* | 7/2010 | Onoe | ................... H03H 9/0211 310/320 |
| 2015/0303896 A1* | 10/2015 | Lim | ........................ H03H 9/13 310/361 |
| 2016/0226465 A1* | 8/2016 | Yamashita | ........... H03H 9/1007 |
| 2018/0006630 A1* | 1/2018 | Kojo | ........................ H03H 9/02 |

(Continued)

FOREIGN PATENT DOCUMENTS

| JP | 2014027505 | 2/2014 |
| JP | 2016197778 | 11/2016 |

*Primary Examiner* — Levi Gannon
(74) *Attorney, Agent, or Firm* — JCIPRNET (57) ABSTRACT

A crystal unit includes an AT-cut crystal element that has a planar shape in a rectangular shape and a part as a thick portion. The crystal element includes a first end portion, a first depressed portion, the thick portion, a second depressed portion, and a second end portion in this order from a side of one short side, in viewing a cross section taken along a longitudinal direction near a center of the short side. The first depressed portion is a depressed portion disposed from the thick portion toward the first end portion side, depressed with a predetermined angle θa and subsequently bulged, and connected to the first end portion. The second depressed portion is a depressed portion disposed from the thick portion toward the second end portion side, depressed with a predetermined angle θb and subsequently bulged, and connected to the second end portion.

3 Claims, 7 Drawing Sheets

(56) References Cited

U.S. PATENT DOCUMENTS

| | | | |
|---|---|---|---|
| 2018/0076792 A1* | 3/2018 | Asai | H03H 9/19 |
| 2018/0226943 A1* | 8/2018 | Kidu | H01L 41/18 |
| 2019/0207584 A1* | 7/2019 | Miyazaki | H01L 41/09 |
| 2020/0014366 A1* | 1/2020 | Ikeda | H03H 9/10 |

\* cited by examiner

CRYSTAL UNIT

CROSS-REFERENCE TO RELATED APPLICATIONS

This application is based on and claims priority under 35 U.S.C. § 119 to Japanese Patent Application No. 2018-083011, filed on Apr. 24, 2018, and the entire content of which is incorporated herein by reference.

TECHNICAL FIELD

This disclosure relates to a crystal unit using an AT-cut crystal element.

DESCRIPTION OF THE RELATED ART

As downsizing of an AT-cut crystal unit proceeds, it has become difficult to manufacture crystal elements for crystal units by a manufacturing method of mechanical processing. Accordingly, an AT-cut crystal element manufactured using a photolithography technique and a wet etching technique has been developed.

For example, Japanese Unexamined Patent Application Publication No. 2014-27505 has disclosed a crystal unit that uses an AT-cut crystal element manufactured by the above-described technique. Specifically, Paragraph 0053 and FIG. 6 in Japanese Unexamined Patent Application Publication No. 2014-27505 disclose a crystal unit where a side surface on a +X-side among side surfaces (X-surfaces) intersecting with an X-axis of a crystal is constituted of six surfaces and a side surface on a −X-side is constituted of two surfaces, and a part of this crystal unit is configured as a thick portion (mesa-shaped). This crystal unit can achieve a crystal unit that has a low crystal impedance (CI) value and an improved frequency versus temperature characteristic (Paragraph 0008 in Japanese Unexamined Patent Application Publication No. 2014-27505).

The crystal unit in Japanese Unexamined Patent Application Publication No. 2014-27505 has a mesa structure and includes a thick portion, an inclined portion connected to the thick portion, and a thin portion connected to the inclined portion. The inclined portion includes two inclined portions of a +X-side inclined portion (a crystal surface 133 in FIG. 6(b) in Japanese Unexamined Patent Application Publication No. 2014-27505) and a −X-side inclined portion (an inclined surface 23 in the identical drawing).

Then, it is described that an angle between an inclined surface of the +X-side inclined portion and a normal line of a principal surface of the thick portion is about 27° (fourth line to fifth line in Paragraph 57 in Japanese Unexamined Patent Application Publication No. 2014-27505). Therefore, the +X-side inclined portion inclines toward the thin portion having an angle of about 63°. It is described that an angle between a crystal surface of the −X-side inclined portion and the normal line of the principal surface of the thick portion is about 55° (second line to third line in Paragraph 55 in Japanese Unexamined Patent Application Publication No. 2014-27505). Therefore, the −X-side inclined portion inclines toward the thin portion having an angle of about 35°. Against this related art, it has been desired another preferred structure for a connecting part of the thick portion and the thin portion.

A need thus exists for a crystal unit which is not susceptible to the drawback mentioned above.

SUMMARY

According to an aspect of this disclosure, there is provided a crystal unit that includes an AT-cut crystal element that has a planar shape in a rectangular shape and a part as a thick portion. The crystal element includes a first end portion, a first depressed portion, the thick portion, a second depressed portion, and a second end portion in this order from a side of one short side in viewing a cross section taken along a longitudinal direction near a center of the short side. The first depressed portion is a depressed portion disposed from the thick portion toward a side of the first end portion, and a surface of the first depressed portion is depressed with a predetermined angle θa and subsequently bulged, and connected to the first end portion. The second depressed portion is a depressed portion disposed from the thick portion toward a side of the second end portion, and a surface of the second depressed portion is depressed with a predetermined angle θb and subsequently bulged, and connected to the second end portion. When a dimension from a distal end of the first end portion to an edge on a side of the second depressed portion of the thick portion is defined as L, the L satisfies a following formula (1). In the formula (1), n is a natural number, and λ is a wavelength of a flexure vibration that propagates along an X-axis of a crystal in the crystal unit, $$L = \lambda \times (n/2 \pm 1/8) \qquad (1).$$

The crystal unit in this application includes a common crystal unit, a crystal unit installed in a package with an oscillator circuit to constitute a crystal controlled oscillator, a crystal unit that includes various temperature sensors such as a thermistor and a PN diode, and similar crystal unit.

The planar shape in the rectangular shape in this application includes an approximately rectangular shape in a range without damaging the object of this disclosure such that a rectangle has R-shaped corner portions.

BRIEF DESCRIPTION OF THE DRAWINGS

The foregoing and additional features and characteristics of this disclosure will become more apparent from the following detailed description considered with reference to the accompanying drawings.

DESCRIPTION OF EMBODIMENTS

The following describes an embodiment of a crystal unit according to the disclosure with reference to the drawings. Each drawing used in the descriptions is merely illustrated schematically for understanding the disclosure. In each drawing used in the descriptions, like reference numerals designate corresponding or identical elements, and therefore such elements will not be further elaborated here in some cases. Shapes, dimensions, materials, and similar factor described in the following embodiment are merely preferable examples within the scope of the disclosure. Therefore, the disclosure is not limited to only the following embodiment.

[1. Description of Crystal Unit]
[1-1. Structure of Crystal Element]

Figure 1A:
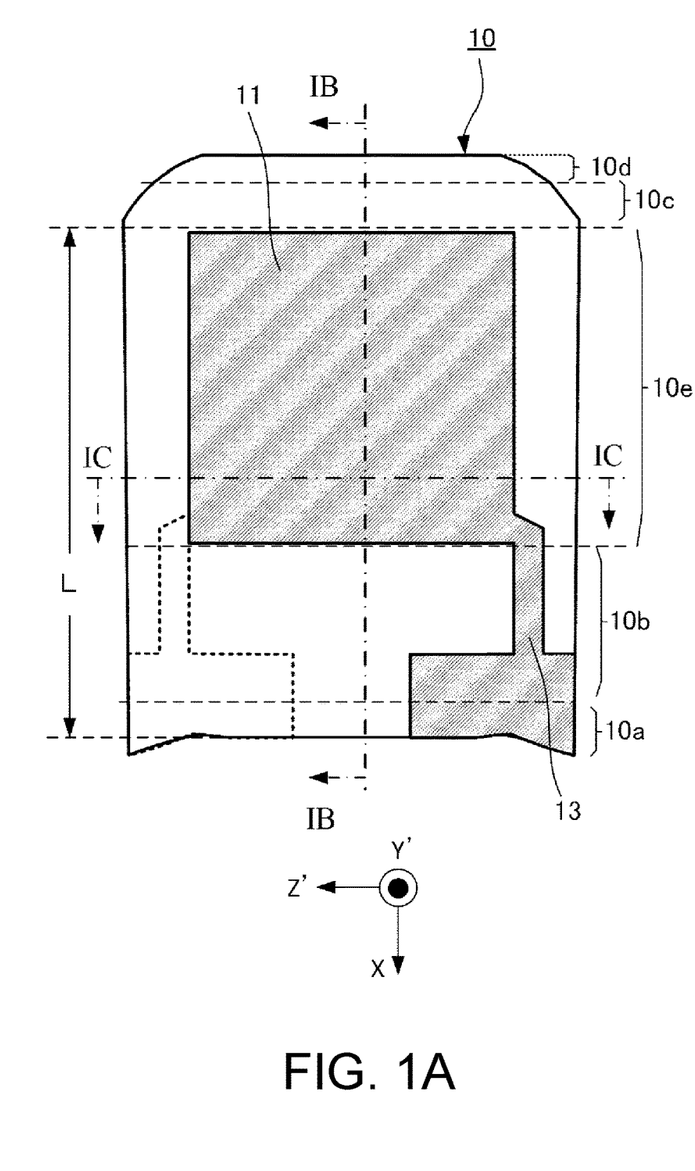
FIG. 1A to FIG. 1C are explanatory drawings of an AT-cut crystal element 10 included in a crystal unit of an embodiment.
Figure 1B:
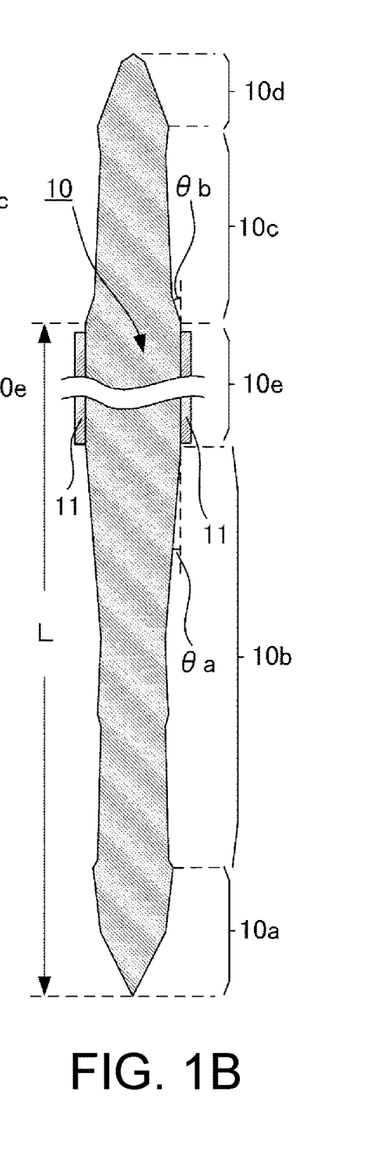
Figure 1C:
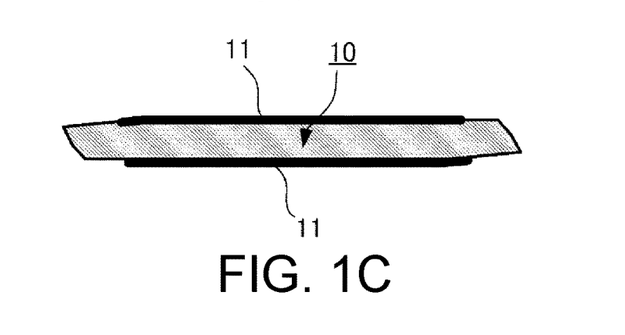
Figure 2A:
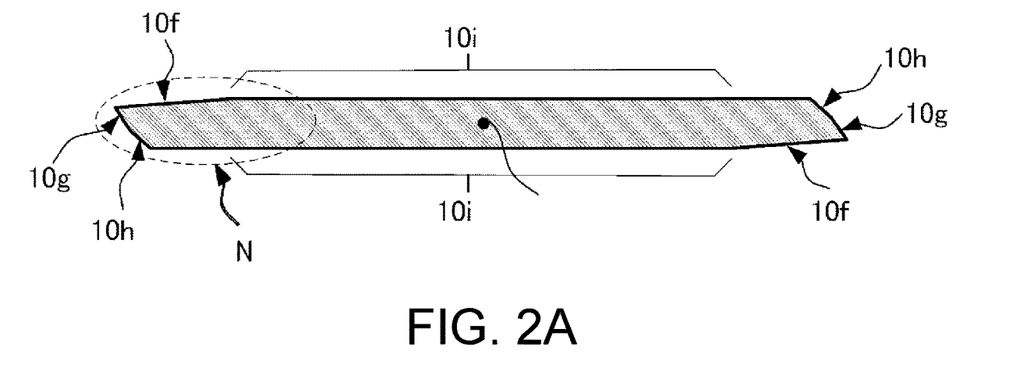
FIG. 2A and FIG. 2B are explanatory drawings of a side surface intersecting with especially a Z'-axis of the crystal element 10.
Figure 2B:
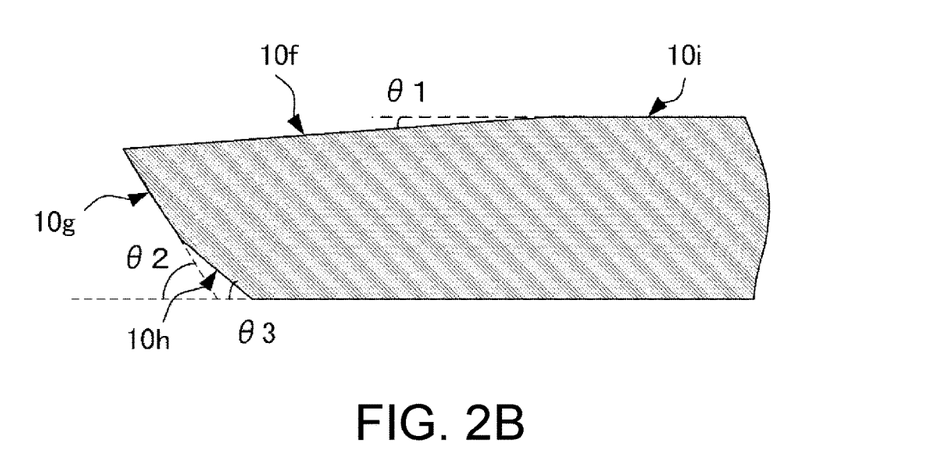

First, with reference to FIG. 1A to FIG. 2B, an AT-cut crystal element 10 included in a crystal unit of the embodiment will be described. FIG. 1A is a plan view of the crystal element 10, FIG. 1B is a sectional drawing of the crystal element 10 taken along the line IB-IB in FIG. 1A, and FIG. 1C is a sectional drawing of the crystal element 10 taken along the line IC-IC in FIG. 1A. FIG. 1B illustrates a first end portion 10a, a first depressed portion 10b, a second depressed portion 10c, and a second end portion 10d, which are features of the disclosure, enlarged for easy understanding, and illustrates a thick portion 10e while omitting a part of a region along a longitudinal direction of the crystal element 10 due to its limited space for the disclosure. FIG. 2A is an enlarged figure of FIG. 1C, and FIG. 2B is an enlarged figure of a part N in FIG. 2A.

Coordinate axes X, Y', and Z' illustrated in FIG. 1A are crystallographic axes of crystal in the AT-cut crystal element 10. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The crystal element 10 of this embodiment is an AT-cut crystal element that has a planar shape in a rectangular shape, a part as the thick portion 10e, a long side parallel to the X-axis of the crystal, a short side parallel to the Z'-axis of the crystal, and is formed from a crystal element having a predetermined direction angle.

Moreover, in viewing a cross section (namely the cross section taken along the line IB-IB) taken along the longitudinal direction near the center of the short side, the crystal element 10 includes the first end portion 10a, the first depressed portion 10b, the thick portion 10e, the second depressed portion 10c, and the second end portion 10d in this order from a side of one short side (in the case of FIG. 1A to FIG. 1C, the +X-side short side).

Moreover, as illustrated in especially FIG. 1B, the first depressed portion 10b is a depressed portion that is disposed from the thick portion 10e toward the first end portion 10a side, and a surface of the first depressed portion 10b is depressed with a predetermined angle θa and subsequently bulged, and furthermore in this example, depressed a little and bulged again, and connected to the first end portion 10a.

The second depressed portion 10c is a depressed portion that is disposed from the thick portion 10e toward the second end portion 10d side, and a surface of the second depressed portion 10c is depressed with a predetermined angle θb and subsequently depressed with an angle smaller than the angle θb, and subsequently bulged, and connected to the second end portion 10d.

Here, the angle θa is an angle between a principal surface of the thick portion 10e and an inclined surface of the first depressed portion 10b on a side of the thick portion 10e, and is specifically 4° to 8°, and typically about 6°. The angle θb is an angle between the principal surface of the thick portion 10e and an inclined surface of the second depressed portion 10c on a side of the thick portion 10e, and is specifically 14° to 18°, and typically about 16°. While these angles θa and θb have slight dispersion, experiments up to the present by inventors of the embodiment shows that the angle θa indicates 6°±2° and the angle θb indicates 16°±2° as described above.

Furthermore, in the crystal element 10, as illustrated in FIG. 1A to FIG. 1C, when a dimension from a distal end of the first end portion 10a to an edge on a side of the second depressed portion 10c of the thick portion 10e is defined as L, L is a dimension that satisfies the following formula (1). However, in the formula (1), n is a natural number, λ is a wavelength of a flexure vibration that propagates along the X-axis of the crystal in the crystal unit. When a resonance frequency of a thickness-shear vibration as a main vibration of the crystal unit is defined as F0, this λ varies with this F0. A relationship between λ and F0 is expressed, for example, in the following formula (2) in accordance with examinations by the inventors of the embodiment. Apparently, this formula (2) is one example.

$$L = \lambda \times (n/2 \pm \tfrac{1}{8}) \tag{1}$$

$$\lambda = 1943/F0 - 12.8 \tag{2}$$

As illustrated in FIG. 1B, the first end portion 10a is constituted of four surfaces and is formed to have a protrusion shape toward a +X-direction. The second end portion 10d is constituted of four surfaces and is formed to have a protrusion shape toward a −X-direction. The second end portion 10d may be constituted of five or more surfaces, for example, five or six surfaces. When a period of wet etching for forming an outer shape of the crystal element is made long, the number of surfaces may increase.

Here, dimensions of the long side and the short side of the crystal element 10, and respective dimensions of the first end portion 10a, the first depressed portion 10b, the second depressed portion 10c, the second end portion 10d, and the thick portion 10e along the longitudinal direction of the crystal element 10 may be configured to be any dimensions corresponding to a specification required for the crystal unit.

In the case of the crystal element 10 of this embodiment, the dimensions of the first end portion 10a, the first depressed portion 10b, the second depressed portion 10c, and the second end portion 10d along the longitudinal direction of the crystal element 10 are configured to be about 50 µm, about 180 µm, about 80 µm, and about 40 µm, respectively. Therefore, the dimension of the first depressed portion 10b is longer than the dimension of the second depressed portion 10c by more than two times.

In the case of this crystal element 10, as illustrated especially in FIG. 2B, each side surface (Z'-surface) intersecting with the Z'-axis of the crystal element 10 is a side surface constituted of three surfaces of a first surface 10f, a second surface 10g, and a third surface 10h. Moreover, the first surface 10f is a surface intersecting with a principal surface 10i of the crystal element 10, and a surface corresponding to a surface obtained by rotating the principal surface 10i by θ1 having the X-axis of the crystal as a rotation axis.

Furthermore, the crystal element 10 has the first surface 10f, the second surface 10g, and the third surface 10h intersecting in this order. Moreover, the second surface 10g is a surface corresponding to a surface obtained by rotating the principal surface 10i by θ2 having the X-axis of the crystal as a rotation axis, and the third surface 10h is a surface corresponding to a surface obtained by rotating the principal surface 10i by θ3 having the X-axis of the crystal as a rotation axis. The experiments by this applicant have shown that the angles θ1, θ2, and θ3 are preferably as follows: θ1=4°±3.5°, θ2=−57°±5°, and θ3=−42°±5°, and more preferably, θ1=4°±3°, θ2=−57°±3°, and θ3=−42°±3°. The angles θ1 to θ3 have been described in Japanese Unexamined Patent Application Publication No. 2016-197778 by this applicant, thus omitting the description here.

The side surface (Z'-surface) intersecting with the Z'-axis constituted of the predetermined three surfaces as described above preferably ensures reduction of unnecessary vibrations in a short side direction.

The crystal element 10 includes excitation electrodes 11 on front and back surfaces of the thick portion 10e, or on wider predetermined regions including the front and back surfaces, and furthermore, the crystal element 10 includes extraction electrodes 13 extracted from the excitation electrodes 11 to a side of one short side of the crystal element 10. The excitation electrode 11 and the extraction electrode 13 each can be formed of a laminated film of chrome and gold, typically.

Figure 3:
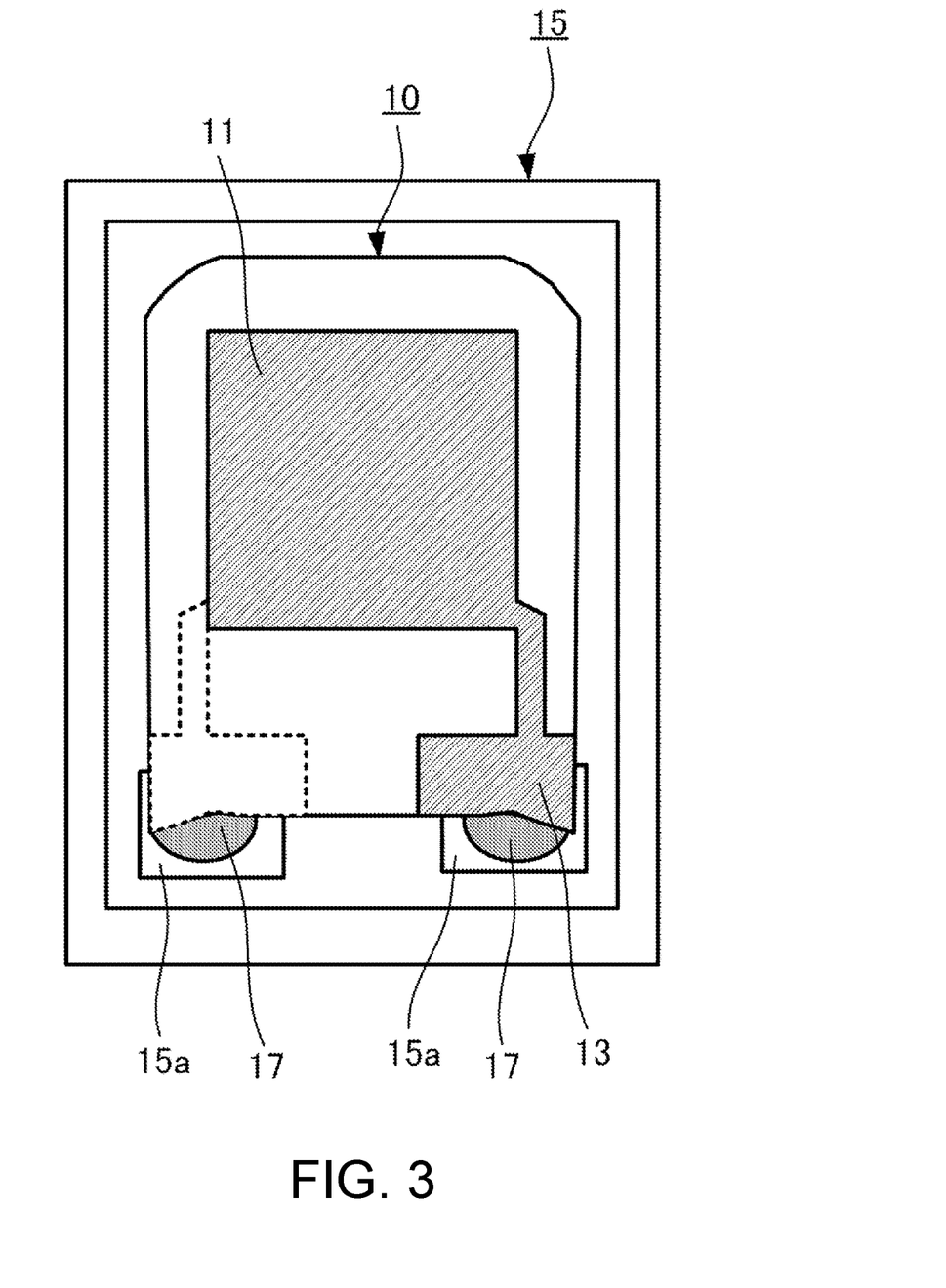
FIG. 3 is a plan view illustrating a state where the crystal element 10 is installed on a ceramic package.

As illustrated in FIG. 3, thus formed crystal element 10 is installed in, for example, a well-known ceramic package 15 at a position of the extraction electrode 13 by, for example, a silicone conductive adhesive 17. Furthermore, the ceramic package is sealed in a sealing state of vacuum, an inert gas atmosphere, or similar atmosphere with a predetermined lid member (not illustrated), thus configuring the crystal unit of the embodiment. For describing the fixed position of the crystal element 10 in detail, the crystal element 10 is fixed to adhesion pads 15a of the ceramic package 15 near the first end portion 10a by the conductive adhesive 17.

[1-2. Prototype Result and Simulation Result]

As the crystal element 10 whose oscillation frequency has been set at a predetermined frequency, a plurality of types of prototype crystal elements whose dimensions L have been variously varied were manufactured each by a plurality of pieces. Then, using them, a plurality of types of crystal units in a working example having the implement structure and the sealing structure described using FIG. 3 were manufactured.

As a simulation model in a finite element method, a simulation model that is the above-described crystal element 10 and has the various varied dimensions L was prepared, and a relationship between the dimensions L and displacement at the first end portion 10a was examined.

Figure 4:
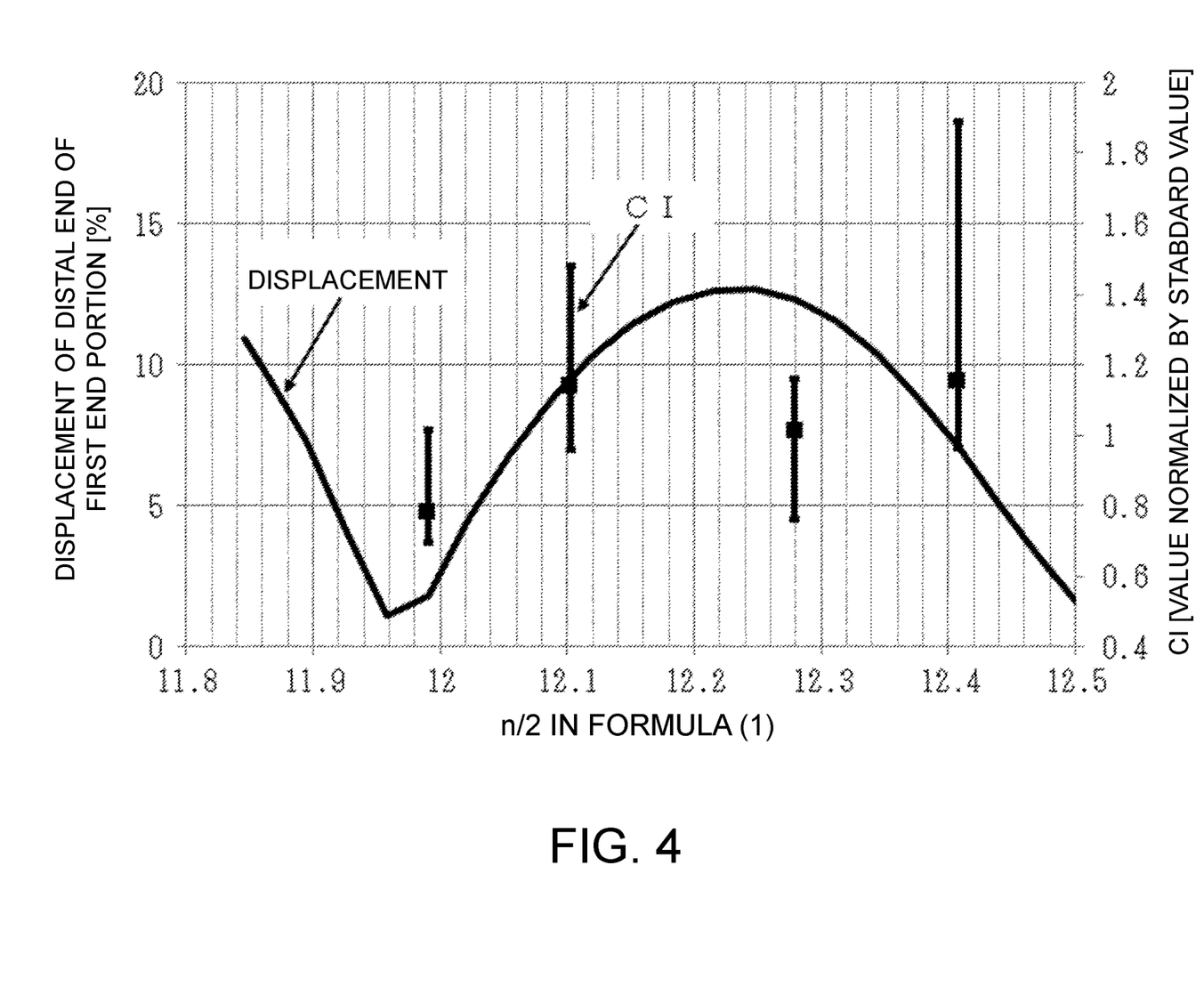
FIG. 4 is an explanatory drawing of a prototype result and a simulation result in the crystal element 10 of the embodiment.

FIG. 4 is a drawing where a horizontal axis takes n/2 in the formula (1), a left vertical axis takes the displacement at a distal end point of the first end portion 10a in the simulation, and a right vertical axis takes CI values by the plurality of types of crystal units manufactured as the prototypes to illustrate a relationship between the displacement and the CI value with respect to n/2. That is, FIG. 4 is a drawing illustrating the relationship between the displacement and the CI value with respect to the dimension L provided in the formula (1) when the wavelength λ is considered as a predetermined value.

However, the displacement is a displacement at the distal end point of the first end portion 10a of the crystal element 10. Actually, there are cases where the displacement occurs to a positive side of the Y'-axis of the crystal element 10 and where the displacement occurs to a negative side of the Y'-axis of the crystal element 10, but the displacement is a displacement indicated by an absolute value in defiance of the direction. Therefore, the smaller the absolute value of the displacement is, the more preferable the crystal element is.

For the CI value, average values, maximum values, and minimum values of the CI values by the crystal units in respective levels are indicated. However, the CI value is considered as a value normalized by a standard value of the CI required for the crystal unit. Therefore, the smaller the normalized CI value is and the smaller a spread between the maximum value and the minimum value with respect to the average value is, the more preferable the crystal element is.

FIG. 4 illustrates an examination result where n is around 24, that is, L is around 12. However, even if n is out of the range illustrated in FIG. 4, the range that satisfies the above-described formula (1) periodically appears, and the effect of the disclosure can be obtained in the respective regions.

The above-described prototype and simulation were performed in a condition where the dimension in the X-direction of the crystal element 10 is about 850 μm and the resonance frequency is 40 MHz. Obviously, these dimension and frequency are one example, and the disclosure is not limited to them.

FIG. 4 indicates that the displacement has a local minimum value as around 2% in the absolute value when n/2 is around 12. It is also seen that the CI value has the average value in the normalized value of around 0.8 and the maximum value of around 1 when L is around 12, thus satisfying the standard of the CI value. Moreover, when n/2 is set as the center and the displacement and the CI value indicate small values in a certain range of its vicinity, this range of the vicinity is estimated around ⅛. It is seen that both of the displacement and the CI are large in the other range. From these, it is seen that the dimension L is preferably selected as satisfying L=λ×(n/2±⅛). The preferable actual dimension L of the crystal element 10 can be calculated by multiplying (n/2±⅛) by the wavelength λ. For example, in the above-described example, since the wavelength λ is about 62 μm, the center value of L is about 740 μm as provided in L=12*62.

[2. Description of Manufacturing Method]

Next, an embodiment of a manufacturing method of the crystal unit will be described with reference to FIG. 5A to FIG. 7C.

A large number of the crystal elements 10 of the embodiment can be manufactured from a quartz-crystal wafer by a photolithography technique and a wet etching technique. Therefore, the following drawings used for the description of an exemplary manufacturing method include plan views of a quartz-crystal wafer 10w and plan views illustrating an enlarged part M of the quartz-crystal wafer 10w. Furthermore, the drawings used for the description of the exemplary manufacturing method include sectional drawings of the crystal element 10 as well. Each sectional drawing illustrates a cross section taken along the line VC-VC, the line VIC-VIC, or the line VIIC-VIIC in the corresponding plan view.

Figure 5A:
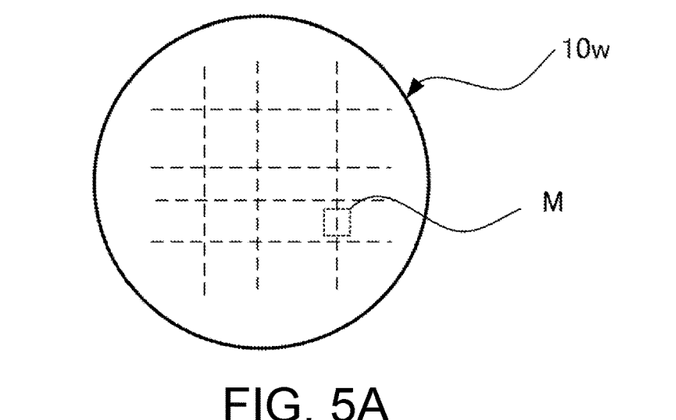
FIG. 5A to FIG. 5C are explanatory drawings of an exemplary manufacturing method of the crystal element 10.
Figure 5B:
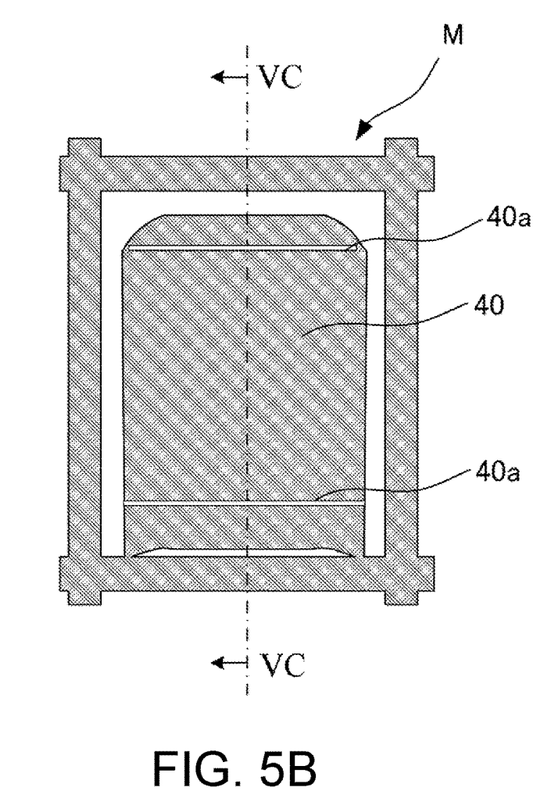
Figure 5C:
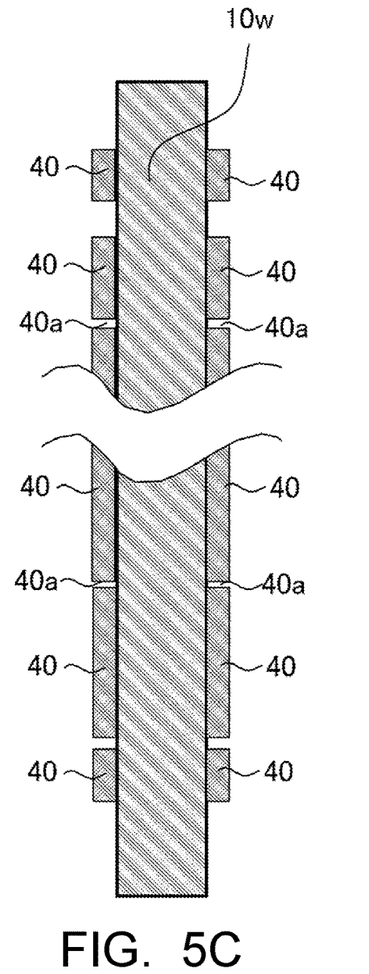

First, the quartz-crystal wafer 10w is prepared (FIG. 5A). While the oscillation frequency of the AT-cut crystal element 10 is, as well known, almost determined by the thickness of the principal surface (X-Z' surface) part of the crystal element 10, the quartz-crystal wafer 10w to be prepared is a wafer thicker than a final thickness of the crystal element 10.

Next, the well-known film forming technique and photolithography technique are used to form wet etching resist masks 40, which are masks to form an outer shape of the crystal element, on both front and back surfaces of the quartz-crystal wafer 10w. The wet etching resist masks 40 according to the embodiment are configured of a part corresponding to the outer shape of the crystal element, a frame part that holds each crystal element, and a connecting part that connects the crystal element to the frame part. However, in this embodiment, the wet etching resist mask is formed such that regions corresponding to the above-described respective first depressed portion and second depressed portion each have a part that has an opening 40*a*. The opening 40*a* does not pass through the quartz-crystal wafer 10*w*, but a wet etching solution can enter the opening 40*a* to an extent that the quartz-crystal wafer 10*w* is etched by a desired amount. Specifically, for example, the wet etching resist mask 40 formed of the laminated film of a chrome film and a gold film, and the wet etching resist mask 40 where this metal film is removed from the above-described predetermined part to form the opening 40*a* is formed. The position of an opening on the distal end side (−X-side) of the crystal element 10 among the openings 40*a* is considered as a position where the above-described dimension L is obtained.

The opening 40*a* has a dimension along the thickness direction of the crystal element 10 such that the opening 40*a* does not pass through the quartz-crystal wafer 10*w*, but a wet etching solution can enter the opening 40*a* to an extent that the quartz-crystal wafer 10*w* is etched by a desired amount as described above, and the dimension is typically a few μm, for example, 2 μm. However, this value can be changed corresponding to the thickness of the quartz-crystal wafer 10*w*, the depths and the sizes of the first depressed portion and the second depressed portion, and similar factor. The dimension of the opening 40*a* along the short side direction of the crystal element 10 is preferred to be a dimension similar to the width dimension of the crystal element. However, this dimension can be changed to be wider or narrower corresponding to the thickness of the quartz-crystal wafer 10*w*, the sizes of the first depressed portion and the second depressed portion. While the number of the openings 40*a* is one for each of both end regions of the crystal element in the example in FIG. 5A to FIG. 5C, not limiting to this, a plurality of openings 40*a* may be provided, or one opening 40*a* may be provided on one region while a plurality of openings 40*a* may be provided on the other region. While the opening 40*a* has a planar shape in an extremely elongated rectangular shape in the example in FIG. 5A to FIG. 5C, this shape may be changed as well.

Next, the quartz-crystal wafer 10*w* on which the wet etching resist mask 40 has been formed is dipped in the wet etching solution for a predetermined period. For the etching solution, a hydrofluoric acid-based etchant is used. The predetermined period is a period where the etching solution can pass through the quartz-crystal wafer 10*w* so as to obtain a contour of an outer shape of the crystal element 10 plus something extra.

In this etching, since the etching solution sufficiently enters the opening of the quartz-crystal wafer 10*w* nearby a forming scheduled region of the crystal element 10 and is diffused, the etching proceeds to sufficiently pass through the quartz-crystal wafer 10*w* itself. On the other hand, since the opening 40*a* part has a narrow opening dimension, the wet etching solution enters the quartz-crystal wafer 10*w* part under the opening 40*a* little by little. Therefore, the wet etching solution does not lead to pass through the quartz-crystal wafer 10*w*, and the regions of the openings 40*a* and the quartz-crystal wafer 10*w* part under the mask nearby the regions of the openings 40*a* are etched.

Figure 6A:
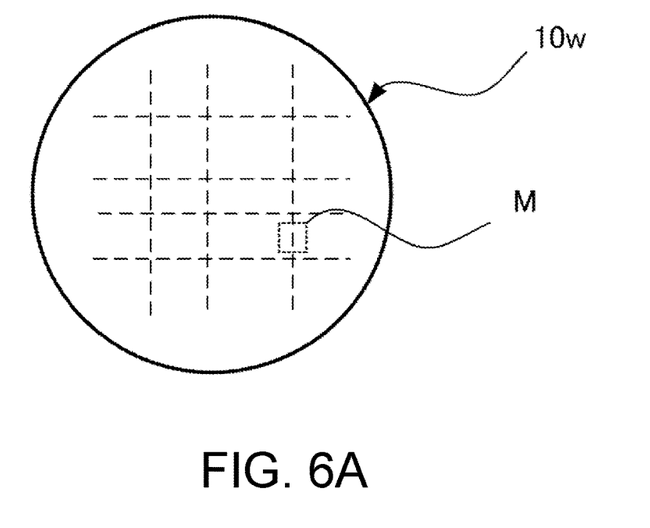
FIG. 6A to FIG. 6C are explanatory drawings of the exemplary manufacturing method of the crystal element 10 following FIG. 5A to FIG. 5C.
Figure 6B:
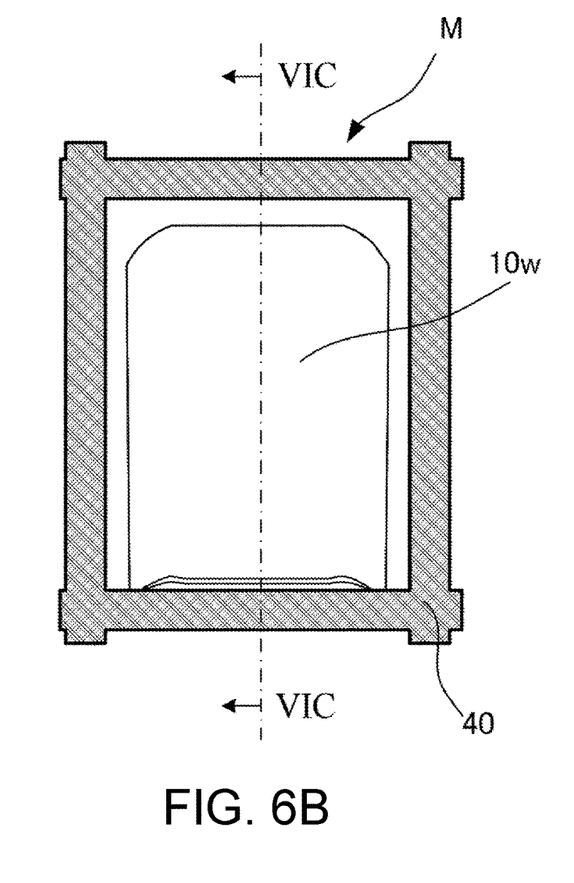
Figure 6C:
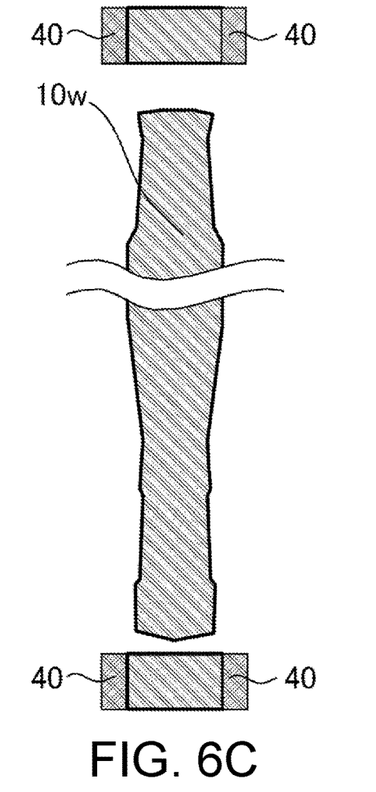

FIG. 6A to FIG. 6C illustrate a state of a sample where the above-described outer shape etching has terminated, and illustrates the wet etching resist mask 40 removed except the frame part. The quartz-crystal wafer 10*w* is obtained in an intermediate state before the first end portion 10*a*, the first depressed portion 10*b*, the thick portion 10*e*, the second depressed portion 10*c*, and the second end portion 10*d* are each completed.

Figure 7A:
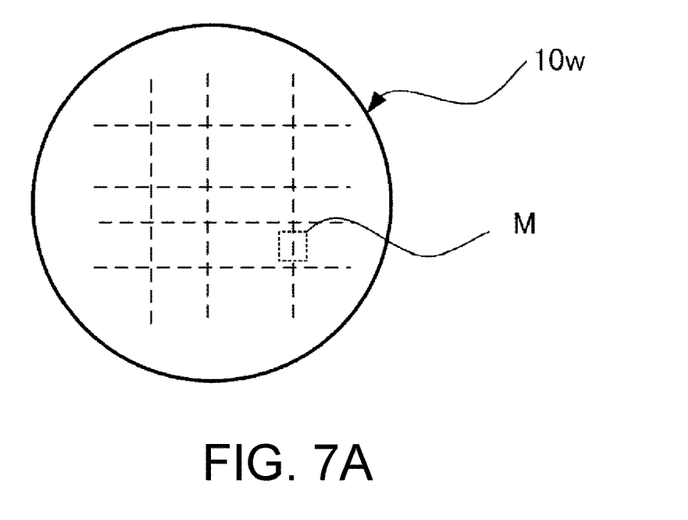
FIG. 7A to FIG. 7C are explanatory drawings of the exemplary manufacturing method of the crystal element 10 following FIG. 6A to FIG. 6C.
Figure 7B:
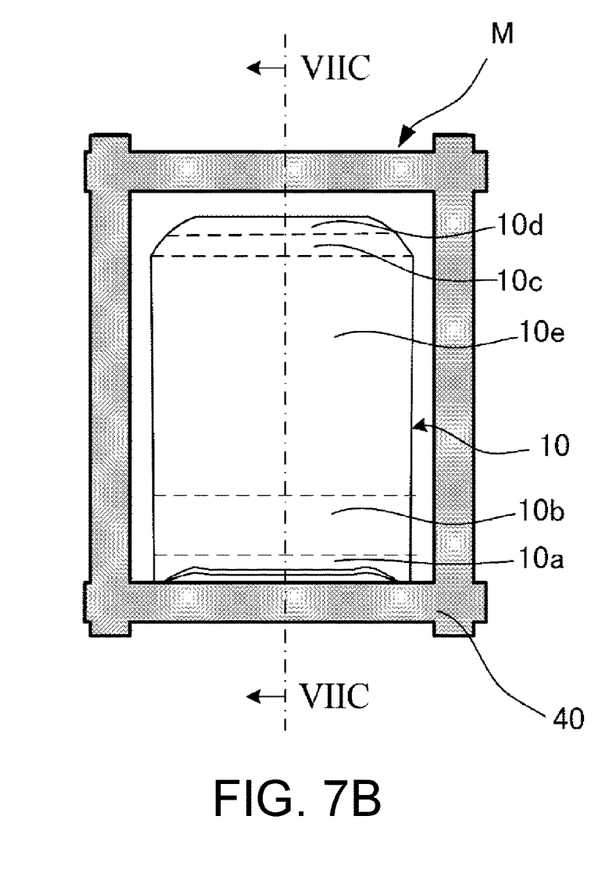
Figure 7C:
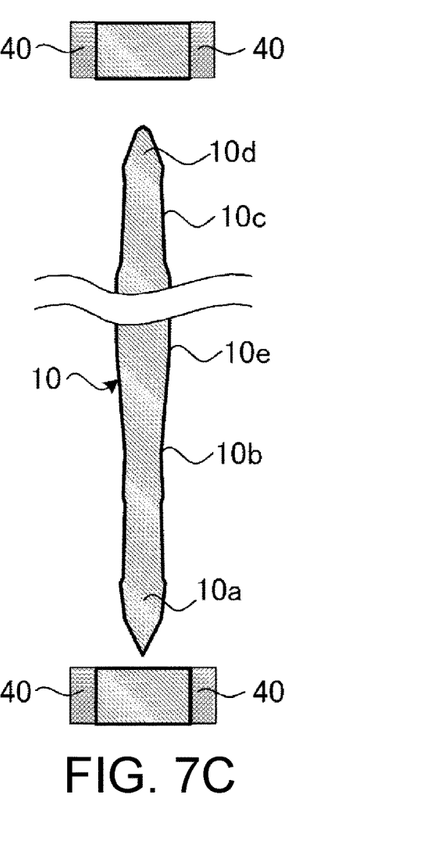

Next, this quartz-crystal wafer 10*w* in this intermediate state is dipped again in the etching solution mainly composed of hydrofluoric acid for a predetermined period. Here, the predetermined period is a period during which the thickness of the forming scheduled region for the thick portion 10*e* of the crystal element 10 can satisfy a specification of the oscillation frequency required for the crystal element 10, and the first to third surfaces 10*f* to 10*h* can be formed on a side surface intersecting with the Z'-axis of the crystal element 10. When this etching terminates, the main part of the crystal element 10 including the first end portion 10*a*, the first depressed portion 10*b*, the thick portion 10*e*, the second depressed portion 10*c*, and the second end portion 10*d* is completed as illustrated in FIG. 7A to FIG. 7C.

Next, the remaining part of the wet etching resist mask 40 is removed from the quartz-crystal wafer 10*w* after the above-described etching is performed to expose the entire crystal surface (not illustrated). After that, the well-known film formation method is used to form a metal film (not illustrated) for forming excitation electrodes and extraction electrodes of the crystal unit on the entire surface of the quartz-crystal wafer 10*w*. Next, the well-known photolithography technique and metal etching technique are used to process the metal film, thus the quartz-crystal wafer 10*w* that includes a large number of the crystal elements 10 illustrated in FIG. 1A to FIG. 1C is completed.

Next, an appropriate external force is applied to the connecting portion of each crystal element 10 of the quartz-crystal wafer 10*w* to separate the crystal element 10 from the quartz-crystal wafer 10*w*, thus separating into individual pieces. Thus formed crystal element is installed in the container and sealed as described above, thus providing the crystal unit of the embodiment as illustrated in FIG. 3.

In the above-described manufacturing method, the predetermined opening 40*a* is provided to the wet etching resist mask 40 to perform the outer shape etching, thus ensuring simultaneously forming a mesa structure when the outer shape etching is performed. Accordingly, a novel mesa structure can be formed without using a mask exclusive for forming the mesa structure.

The crystal unit of the embodiment provides a unique mesa structure that has the depressed portion from the thick portion on each of both sides along the longitudinal direction of the crystal element, and defines the dimensions L from the distal end of the first end portion to the edge on the second depressed portion side of the thick portion as a predetermined dimension around n/2 times of the wavelength λ of the flexure vibration as provided in the formula (1). With this mesa structure, vibration is properly confined to the thick portion compared with a simple mesa structure. In view of this, the improvement of the characteristics of the crystal unit is ensured.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal unit, comprising:
an AT-cut crystal element that has a nearly-rectangular shape in a plan view and a part as a thick portion, wherein
the AT-cut crystal element includes a first end portion, a first depressed portion, the thick portion, a second depressed portion, and a second end portion in this order from a side of one short side, in viewing a cross section taken along a longitudinal direction near a center of the short side of the AT-cut crystal element,
the first depressed portion is a depressed portion disposed from the thick portion toward a side of the first end portion, and a surface of the first depressed portion is depressed with a predetermined angle θa and subsequently bulged, and connected to the first end portion,
the second depressed portion is a depressed portion disposed from the thick portion toward a side of the second end portion, and a surface of the second depressed portion is depressed with a predetermined angle θb and subsequently bulged, and connected to the second end portion, and
when a dimension from a distal end of the first end portion to an edge on a side of the second depressed portion of the thick portion is defined as L, the L satisfies a following formula (1),
in the formula (1), n is a natural number, and λ is a wavelength of a flexure vibration that propagates along an X-axis of a crystal in the crystal unit, $$L = \lambda \times (n/2 \pm \frac{1}{8}) \tag{1}.$$

2. The crystal unit according to claim 1, wherein
the AT-cut crystal element has a long side parallel to the X-axis of the crystal and a short side parallel to a Z'-axis of the crystal, and
the first end portion is positioned on a +X-side.

3. The crystal unit according to claim 1, wherein:
the AT-cut crystal element has a long side parallel to the X-axis of the crystal and a short side parallel to a Z'-axis of the crystal,
the first end portion is positioned on a +X-side,
the predetermined angle θa is 6°±2°, and
the predetermined angle θb is 16°±2°.

* * * * *